(12) United States Patent
Kosinski et al.

(10) Patent No.: US 6,459,345 B1
(45) Date of Patent: Oct. 1, 2002

(54) PROGRAMMABLE SAW FILTER INCLUDING UNIDIRECTIONAL TRANSDUCERS

(75) Inventors: John A. Kosinski, Wall, NJ (US); Robert A. Pastore, Jr., Freehold, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 09/928,701

(22) Filed: Aug. 8, 2001

(51) Int. Cl.$^7$ ................................................ H03H 9/64
(52) U.S. Cl. .................... 333/166; 333/193; 310/313 B
(58) Field of Search ................................. 333/193–196, 333/166, 150, 151, 152, 154; 310/313 R, 313 B, 313 C

(56) References Cited

U.S. PATENT DOCUMENTS

| | | | | |
|---|---|---|---|---|
| 3,723,919 A | * | 3/1973 | Adler | 333/194 |
| 3,800,248 A | * | 3/1974 | Speiser et al. | 333/154 |
| 4,024,480 A | * | 5/1977 | Reeder et al. | 333/166 |
| 4,237,432 A | * | 12/1980 | Huang et al. | 333/194 |
| 4,254,388 A | * | 3/1981 | Mikoshiba et al. | 333/195 |
| 4,267,533 A | * | 5/1981 | Dempsey et al. | 333/151 |
| 4,480,237 A | * | 10/1984 | Yamada | 333/193 |
| 4,575,696 A | * | 3/1986 | Hartmann et al. | 333/154 |
| 4,602,228 A | * | 7/1986 | Yamada | 333/194 |
| 4,752,750 A | * | 6/1988 | Zimmerman et al. | 333/166 |
| 4,775,846 A | * | 10/1988 | Shiba et al. | 333/194 |
| 5,051,709 A | * | 9/1991 | Birkett et al. | 333/28 R |
| 5,194,837 A | * | 3/1993 | Smythe, Jr. et al. | 333/166 |
| 5,225,798 A | * | 7/1993 | Hunsinger et al. | 333/165 |
| 5,387,887 A | * | 2/1995 | Zimmerman et al. | 333/166 |
| 5,973,578 A | * | 10/1999 | Zharov et al. | 333/166 |

\* cited by examiner

*Primary Examiner*—Robert Pascal
*Assistant Examiner*—Barbara Summons
(74) *Attorney, Agent, or Firm*—Michael Zelenka; George B. Tereschuk

(57) ABSTRACT

A programmable SAW transversal filter utilizing a finger array and phase shifters to implement unidirectional transducers for providing low insertion loss and reduced or suppressed triple transient echo. A piezoelectric substrate has an input unidirectional transducer and an output unidirectional transducer formed thereon. A surface acoustic wave is transmitted between the input unidirectional transducer and the output unidirectional transducer. Programmable gain devices and phase shifters are coupled to the respective input unidirectional transducer fingers and the output unidirectional transducer fingers forming multi-phase unidirectional transducers. The present invention may be utilized as a transversal filter in many communication devices, and in particular a multi format personal communication system.

11 Claims, 3 Drawing Sheets

PROGRAMMABLE SAW FILTER INCLUDING UNIDIRECTIONAL TRANSDUCERS

GOVERNMENT INTEREST

The invention described herein may be manufactured, used, and licensed by or for the United States Government for governmental purposes without payment to us of any royalties thereon.

FIELD OF THE INVENTION

The invention relates generally to electronic filters, and more particularly to a programmable SAW transversal filter utilizing a phase shifter.

BACKGROUND OF THE INVENTION

In RF (radio frequency), electronic filters SAW (surface acoustic wave) devices are often used. It is often desirable to have RF electronic filters that have desirable electrical behavior, for example, low insertion loss, tunable bandwidth, tunable frequency, tunable filter transfer function. Additionally, it is desirable that such radio frequency electronic filters are capable of being fabricated as fully integrated components in integrated circuits. The radio frequency electronic filter ma y be used as a pre-selector or an IF (intermediate frequency) filter in a radio or communications receiver.

Transversal filters utilizing a SAW device are generally modeled as an input signal that passes through a series of delays. Subsequent to each delay, the signal is sampled or tapped. The various delayed and sampled or tapped signals are weighted in relation to a set of weighting coefficients. The output of the delayed, sampled and weighted signals is summed.

A surface acoustic wave device is comprised of a piezoelectric substrate upon which input and output interdigitated transducers (IDTs) are formed. The IDTs have fingers connected by busbars. The IDT launches an acoustic wave by the piezoelectric effect. The wave propagates as a surface acoustic wave to the output IDT. At each finger of the output IDT, the acoustic wave generates voltage as the wave travels underneath. Therefore, each finger voltage is delayed in time relative to the input by an amount dependent upon the acoustic wave velocity and the position of each finger of the interdigitated transducer. Weighting is often controlled by the length of overlap between adjacent fingers. The summing function is often obtained by busbars.

In order to permit a single device to perform a variety of functions, it is often desirable to provide a programmable SAW transverse filter. In a programmable SAW transverse filter, busbars are replaced by switches or other power splitter or combiner components. Additionally, a weighting function may be provided by gain elements permitting the fingers to have uniform physical overlap.

A programmable transversal filter is disclosed in U.S. Pat. No. 4,752,750 entitled "Hybrid Programmable Transversal Filter" issuing to Zimmerman et al. on Jun. 21, 1988, which is herein incorporated by reference. Therein disclosed is a programmable transversal filter having a SAW delay line made of a first material and monolithic dual gate FET (field effect transistor) arrays to control magnitude and sign of the tap weights made of a different material. Another transversal filter is disclosed in U.S. Pat. No. 5,051,709 entitled "SAW Device Tapped Delay Line And Equalizer" issuing to Birkett et al. on Sep. 24, 1991, which is herein incorporated by reference. Therein disclosed is a SAW device having tapped delay lines that includes apodized IDTs at the input and unapodized IDTs at the output. Each output IDT is terminated with a low impedance to minimize acoustic regeneration by the output IDTs. Grounded dummy fingers are used having the same metallization ratio as the output IDTs. Another transversal filter is disclosed in U.S. Pat. No. 5,194,837 entitled "Multi-Tap Programming Circuit For Transversal Filters" issuing to Smythe, Jr. et al. on Mar. 16, 1993, which is herein incorporated by reference. Therein disclosed is a tapped delay line filter that has a varistor network for tap weighting. Yet another transversal filter is disclosed in U.S. Pat. No. 5,387,887 entitled "Miniature Digitally Controlled Programmable Transverse Filter Using LSI GAAS Integrated Circuits" issuing to Zimmerman et al. on Feb. 7, 1995, which is herein incorporated by reference. Therein disclosed is a digitally controlled programmable transversal filter utilizing large scale integration gallium arsenide integrated circuits to digitally control the magnitude and sign of the tap weights.

While many of these prior devices address the programmability of transversal filters, problems still arise due to triple transient echo (TTE) in SAW programmable SAW transverse filters (PTFs). TTE arises from the basic nature of acoustic wave propagation in a SAW device. Each finger of the IDT is a source of reflection and regeneration of the acoustic wave. In the ideal case, only a single acoustic wave will travel from the input IDT to the output IDT. However, in most actual implementations of a SAW device an undesired signal is reflected from the output IDT back to the input IDT and then back to the output IDT. Each reflection includes a conversion loss due to the IDT bidirectionality, hence the TTE signal is an attenuated and delayed replica of the desired signal. Attempts to eliminate the undesirable TTE have taken the form of impedance mismatch and unidirectional IDT techniques. Impedance mismatch techniques are somewhat effective but cause high insertion loss. They are typically applied to IF filters and involve a system cost in terms of amplification required to make up for the insertion loss.

Several types of unidirectional transducers (UDT) exist. Most types rely on balancing electrode reflection and regeneration to transform the typically bidirectional IDT into a UDT. However, these devices have limitations. For example, all UDTs are inherently bandwidth limited. Additionally, one of the most significant limitations is that most UDTs require an asymmetric finger structure including fingers having varying widths at non-periodic spacing. This asymmetrical finger structure makes most UDT structures incompatible with programmable SAW filters. Therefore, there is a need for a programmable surface acoustic wave transversal filter that suppresses triple transient echo and yet provides low insertion loss.

SUMMARY OF THE INVENTION

The present invention comprises a multi-phase programmable transversal filter. A piezoelectric substrate has two regular arrays of electrode fingers formed thereon. At least some of the electrode fingers have a phase shift associated therewith. Each of the electrode fingers has a gain function associated therewith. A power splitter is associated with the input array to provide a signal to each of the input electrode fingers and a power combiner is associated with the output electrode fingers to provide a summed output. The electrode fingers in combination with the phase shifters result in a programmable multi phase unidirectional surface acoustic wave transversal filter.

Accordingly, it is an object of the present invention to suppress triple transient echo in a programmable transversal filter.

It is an advantage of the present invention that insertion loss is relatively low.

It is a feature of the present invention that unidirectional transducers are utilized.

It is yet another feature of the present invention that the unidirectional transducers are implemented in a multi phase arrangement and that a phase shifter is associated with at least some of the fingers of the unidirectional transducer.

These and other objects, advantages, and features will become readily apparent in view of the following detailed description.

DETAILED DESCRIPTION OF THE PREFERRED EMBODIMENTS

Figure 1:
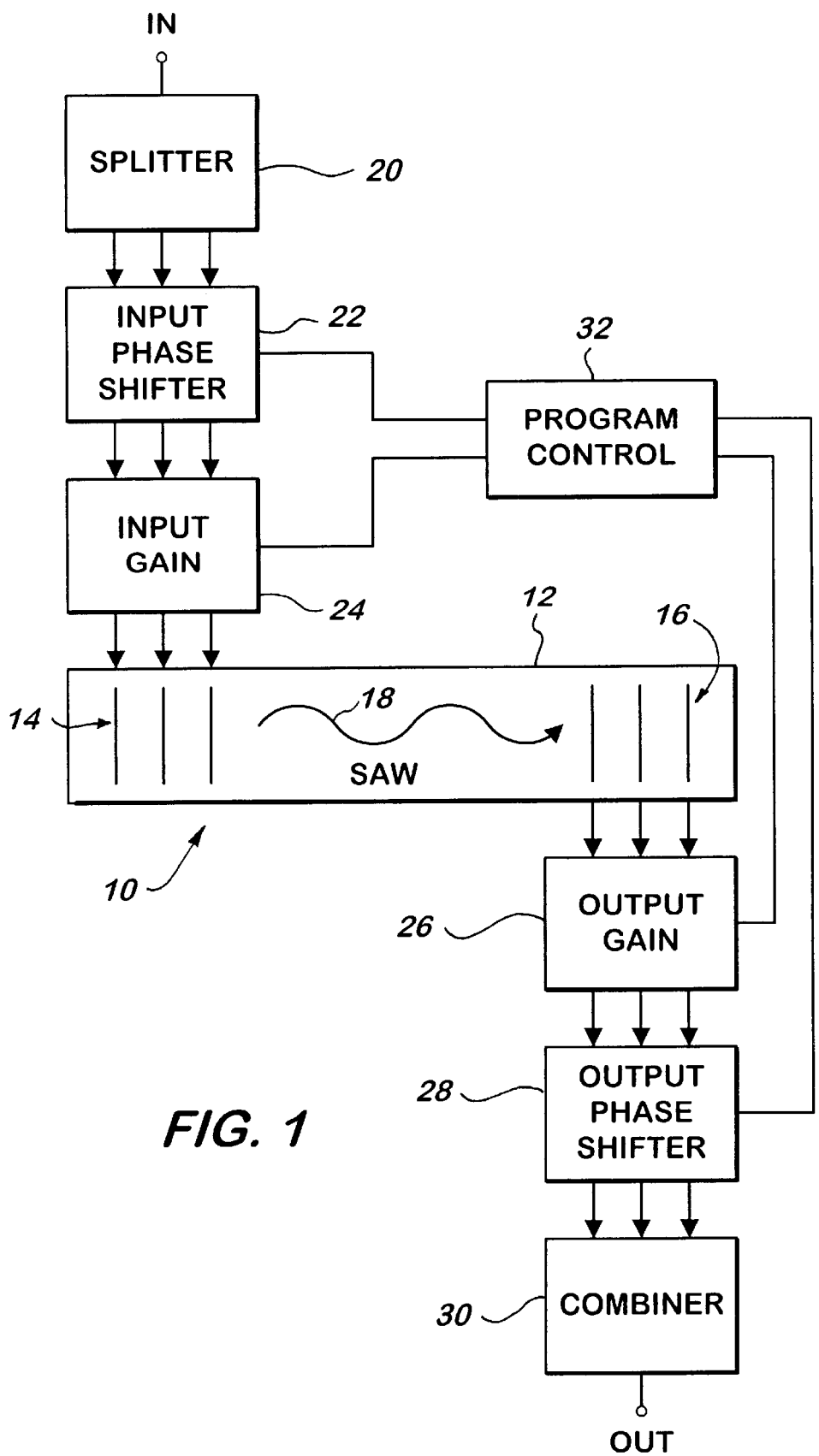
FIG. 1 is a schemmatic block diagram illustrating the present invention.

In FIG. 1, a programmable transversal filter 10 utilizing a surface acoustic wave and unidirectional transducers is schematically illustrated. A piezoelectric substrate 12 has a plurality of electrode fingers comprising an input interdigitated transducer (IDT) formed thereon. The input unidirectional transducer 14 may be regular in that the fingers each have uniform spacing and uniform width. At the other end of the piezoelectric substrate 12 is a plurality of electrode fingers comprising an output interdigitated transducer formed thereon. Waveform 18 represents the surface acoustic wave formed by the input unidirectional transducer 14 and detected by the output unidirectional transducer 16.

Splitter 20 splits an input signal to provide a plurality of input signals that are to be applied to the individual fingers of the input unidirectional transducer 14 through an input phase shifter 22. The input phase shifter 22 independently varies the phase of at least some of the plurality of input signals to be applied to each of the individual fingers of the input unidirectional transducer 14. Proper selection of the signal phase applied to the individual fingers results in the input unidirectional transducer 14 functioning as a unidirectional interdigitated transducer. Input gain control 24 provides a variable gain to each of the plurality of input signals applied to each of the individual fingers of the input unidirectional transducer 14. The output of each finger of the output unidirectional transducer 16 is provided to a variable output gain control 26. Output gain control 26 is variable with a different output gain or weighting coefficient being applied to each of the fingers in the output unidirectional transducer 16. Coupled to the output gain control 26 is an output phase shifter 28. The output phase shifter 28 provides a variable phase shift for at least some of the signals received from the fingers of the output unidirectional transducer 16. Proper selection of the signal phase applied to the individual signals results in the output interdigitated transducer functioning as a unidirectional interdigitated transducer. Combiner 30 combines or sums the signals received from the output phase shifter 28 to form an output signal. Program control 32 is coupled to the input phase shifter 22, the input gain control 24, the output gain control 26, and the output phase shifter 28 to selectively control or program the variable phase and the variable gain of the individual input and output signals.

The programmable transversal filter of the present invention provides unidirectional transducers, which may be implemented as a multi-phase unidirectional transducer. The programmable transversal filter of the present invention may incorporate power splitters or power combiners, phase shifters or time delays, gain blocks and an acoustic finger array. The components may be arranged in multiple configurations. Input and output electronics may be suitably connected to the acoustic portion. Preferably, the input and output electronics are fully integrated circuits comprising the power splitter and power combiner functions, the phase shift, and gain functions. The phase shift and gain functions are variable. A variety of different control circuits may be utilized for providing program control or varying the phase shift and gain functions. There may be a variety of alternative embodiments to implement the present invention. The components may be arranged in multiple configurations. For example, different circuit embodiments may include use of real time delays. A combination of individual phase delays may be used with a switched array gain selection. Additionally, a combination of individual gain selections may be used with a switched array of phase shifters. The present invention may be composed of discrete components, a semiconductor and piezoelectric hybrid, or a fully integrated piezoelectric semiconductor integrated circuit.

Figure 2:
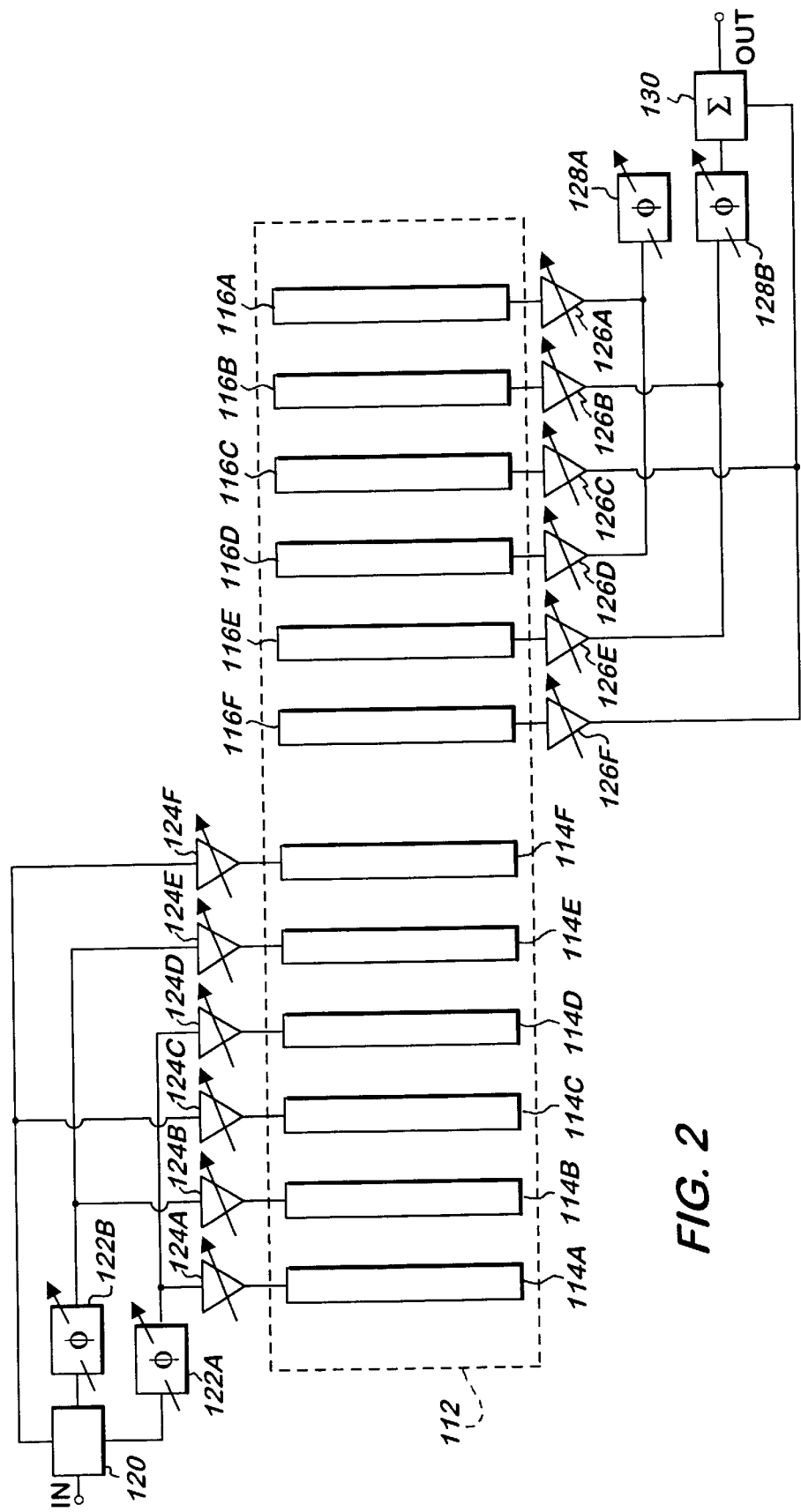
FIG. 2 schematically illustrates an embodiment of the present invention.

FIG. 2 illustrates another embodiment of the present invention. FIG. 2 schematically illustrates the present invention applied to a three-phase unidirectional transducer surface acoustic wave programmable transversal filter. Placed on a piezoelectric substrate 112 are a plurality of input transducer fingers 114A–F. On the other end of the piezoelectric substrate 112 are placed a plurality of output transducer fingers 116A–F. Coupled to each of the input transducer fingers 114A–F is a respective one of a plurality of variable gain devices 124A–F. Each gain device is coupled to a respective finger of the input unidirectional transducer. A splitter 120 provides an input signal along three paths, with each of the three paths coupled to two of the variable gain devices 124A–F. A variable phase shifter 122A and 122B is associated with two of the three paths from the splitter 120. Accordingly, all three paths may operate at a different phase. Therefore, this embodiment is a three phase unidirectional surface acoustic wave programmable transverse filter device. Fingers 114A and 114D have the same phase shift created by phase shifter 122A, fingers 114B and 114E have the same phase shift created by phase shifter 122B, and fingers 114C and 114F have no phase shift applied thereto by a phase shifter.

The output unidirectional transducer is comprised of a plurality of fingers 116A–116F. Each of the plurality of fingers 116A–116F is coupled to a respective variable gain device 126A–126F. Similar to the input, a combiner or summing device 130 combines three paths into a single output. Each of the three paths may function at a different phase. Phase shifter 128A and phase shifter 128B are coupled to two of the three paths. Accordingly, finger 116F and finger 116D have no additional phase shift applied thereto by a phase shifter, fingers 116E and 116B have the same phase shift created by phase shifter 128B, and finger 116D and finger 116A have the same phase shift created by phase shift 128A. Control circuits, not illustrated, are used to control the variable parameters for the phase shifters 122A–B and 128A–B, and the variable gain devices 124A–F and 126A–F.

Figure 3:
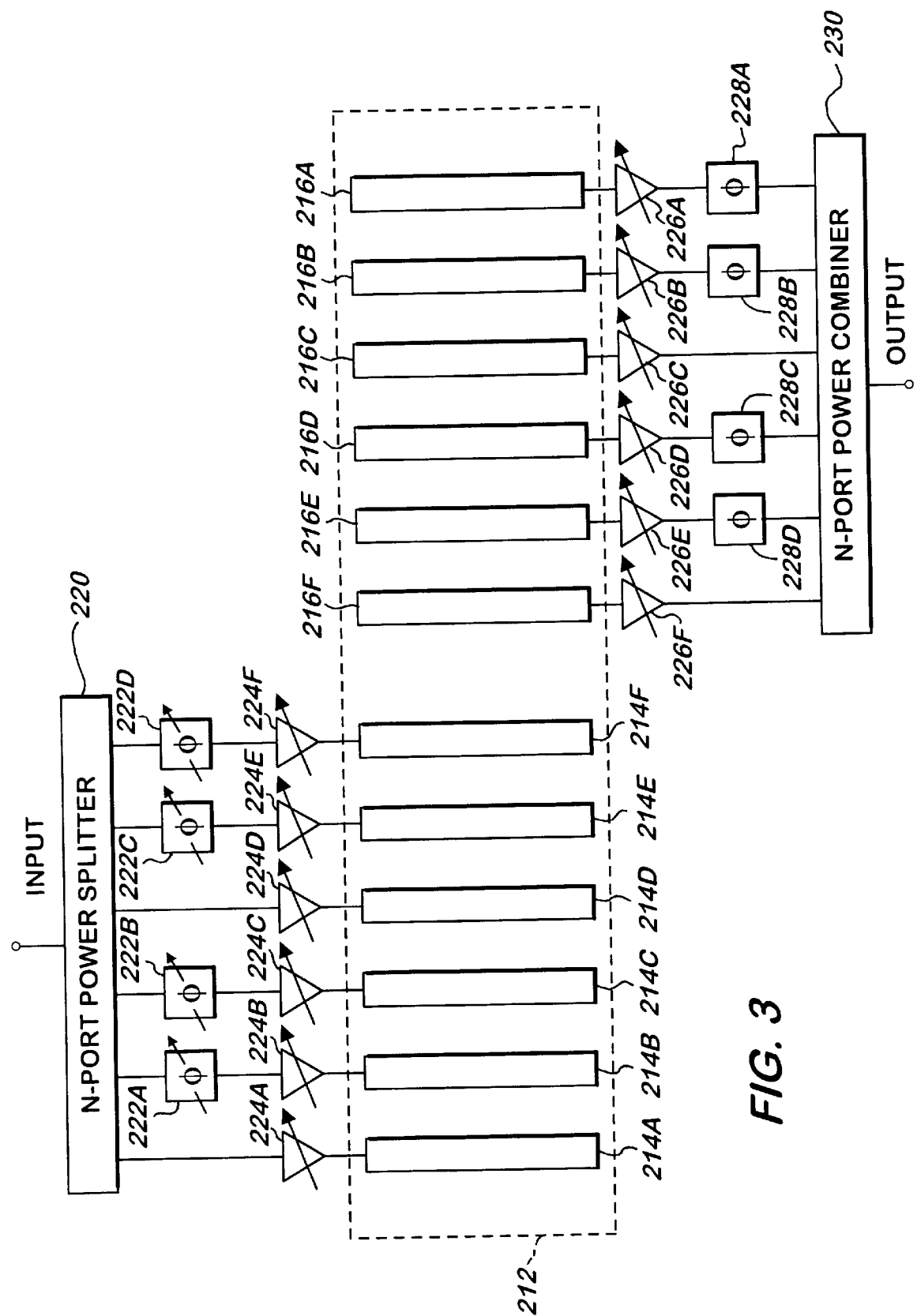
FIG. 3 schematically illustrates another embodiment of the present invention.

FIG. 3 illustrates another embodiment of the present invention. In FIG. 3, an n-port power splitter 220 and an n-port power combiner 230 are utilized. Placed on piezoelectric substrate 212 is a plurality of fingers 214A–F comprising an input unidirectional transducer. A plurality of gain devices 224A–F are provided, with one each of the plurality of gain devices 224A–F coupled to a respective one of the plurality of the fingers 214A–F. Phase shifters 222A–D are coupled to four of the variable gain devices 224B–C and 224E–F, respectively. The n-port power splitter 220 provides a signal to each of the fingers 214A–F. The input is coupled to the n-port power splitter 220.

Similarly, on the output side, an output unidirectional transducer is comprised of a plurality of fingers 216A–F. Each of a plurality of variable gain devices 226A–F is coupled to a respective one of the plurality of fingers 216A–F. Four output phase shifters 228A–D are coupled to four of the variable gain devices 226A–B and 226D–E. An n-port power combiner 230 is coupled to each of the variable gain devices 216A–F to form an output. Control circuits, not illustrated, are used to control the variable parameters of the phase shifters 222A–D and 226A–F, and the variable gain devices 224A–F and 226A–F.

The present invention provides a programmable SAW transverse filter incorporating unidirectional transducers with the unidirectional transducers being implemented in a multi-phase form. The present invention substantially reduces triple transient echo and has a relatively low insertion loss. Accordingly, the present invention advances the transversal filter art and may be utilized in many communication systems. For example, the present application is particularly applicable to multi-format personal communication systems.

While the present invention has been described with respect to several preferred embodiments, it will be appreciated by those skilled in the art that the present invention may take a variety of forms and may be applicable to a variety of different electronic devices without departing from the spirit and scope of this invention.

What is claimed is:

1. A programmable surface acoustic wave filter comprising:
    a piezoelectric substrate;
    a plurality of input transducer fingers formed on said piezoelectric substrate;
    an input gain control coupled to said plurality of input transducer fingers;
    an input phase shifter coupled to said input gain control;
    a splitter coupled to said input phase shifter;
    a plurality of output transducer fingers formed on said piezoelectric substrate;
    an output gain control coupled to said plurality of output transducer fingers;
    an output phase shifter coupled to said output gain control; and
    a combiner coupled to said output phase shifter,
    whereby the programmable surface acoustic wave filter is capable of reducing triple transit echo and providing multi-phase unidirectional transducer characteristics.

2. A programmable surface acoustic wave filter as in claim 1 further comprising:
    a program control coupled to said input gain control, input phase shifter, output gain control, and output phase shifter.

3. A programmable surface acoustic wave filter as in claim 1 wherein:
    said plurality of input transducer fingers comprise a regular array of electrode fingers; and
    said plurality of output transducer fingers comprise a regular array of electrode fingers.

4. A programmable surface acoustic wave filter as in claim 1 wherein:
    said input phase shifter and output phase shifter comprise a real time delay.

5. A programmable surface acoustic wave filter as in claim 1 wherein:
    said input gain control and output gain control comprise a switchable array.

6. A programmable surface acoustic wave filter as in claim 1 wherein:
    said input phase shifter and output phase shifter comprise a switchable array.

7. A programmable surface acoustic wave transverse filter, comprising:
    a piezoelectric substrate;
    an input finger array functioning as a unidirectional transducer placed on said piezoelectric substrate;
    an output finger array functioning as a unidirectional transducer placed on said piezoelectric substrate, whereby a surface acoustic wave is transmitted through said piezoelectric substrate;
    a plurality of input variable gain devices coupled to said input unidirectional transducer;
    a plurality of input variable phase shifters coupled to at least two of said plurality of input variable gain devices;
    a power splitter coupled to said plurality of input variable phase shifters;
    a plurality of output variable gain devices coupled to said output unidirectional transducer;
    a plurality of output variable phase shifters coupled to at least two of said plurality of output variable gain devices; and a power combiner coupled to said plurality of output variable phase shifters and said output variable gain devices, whereby the programmable surface acoustic wave transverse filter has low insertion loss and reduced triple transient echo.

8. A programmable surface acoustic wave transverse filter as in claim 7 further comprising:

a program control coupled to said plurality of input variable gain devices, input variable phase shifters, output variable gain devices, and output variable phase shifters.

9. A programmable surface acoustic wave transverse filter as in claim 7 wherein:

said input unidirectional transducer comprises a regular array of electrode fingers; and said output unidirectional transducer comprises a regular array of electrode fingers.

10. A programmable surface acoustic wave transverse filter as in claim 7 wherein:

said input variable phase shifter and output variable phase shifter comprise a real time delay.

11. A programmable surface acoustic wave transverse filter, comprising:

a piezoelectric substrate;

a first regular array comprising a first plurality of electrode fingers formed on said piezoelectric substrate;

an input variable gain control coupled to each of the first plurality of electrode fingers;

a first input phase shifter coupled to at least two of said first plurality of electrode fingers;

a second input phase shifter coupled to at least two of said first plurality of electrode fingers;

a splitter coupled to said first input phase shifter, second input phase shifter, and at least two of said first plurality of electrode fingers;

a second regular array comprising a second plurality of electrode fingers formed on said piezoelectric substrate;

an output variable gain control coupled to each of the second plurality of electrode fingers;

a first output phase shifter coupled to at least two of said second plurality of electrode fingers;

a second output phase shifter coupled to at least two of said second plurality of electrode fingers;

a combiner coupled to said first output phase shifter, second output phase shifter, and at least two of said second plurality of electrode fingers; and program control means, coupled to each of said input variable gain controls, first and second input variable phase controls, said output variable gain controls, and first and second output variable phase controls, for controlling each of their variable parameters, whereby the programmable variable filter may be programmed as desired.

* * * * *